(12) United States Patent
Lorenzen

(10) Patent No.: US 7,382,630 B2
(45) Date of Patent: Jun. 3, 2008

(54) BOARD-MOUNTING DEVICE

(76) Inventor: Klaus Lorenzen, Doganbay Koyu, Mevkii No: 25, Seferihisar-Izmir (TR)

( * ) Notice: Subject to any disclaimer, the term of this patent is extended or adjusted under 35 U.S.C. 154(b) by 0 days.

(21) Appl. No.: 11/804,962

(22) Filed: May 21, 2007

(65) Prior Publication Data

US 2007/0247827 A1   Oct. 25, 2007

Related U.S. Application Data

(62) Division of application No. 11/236,340, filed on Sep. 27, 2005, now Pat. No. 7,269,031.

(30) Foreign Application Priority Data

Sep. 27, 2004   (DE) ..................... 10 2004 047 117

(51) Int. Cl.
*H05K 7/00* (2006.01)
(52) U.S. Cl. ..................................... 361/801
(58) Field of Classification Search ............... 361/801, 361/759, 760; 439/567, 154
See application file for complete search history.

(56) References Cited

U.S. PATENT DOCUMENTS

| 4,218,724 | A | 8/1980 | Kaufman |
| 4,908,738 | A | 3/1990 | Kobari et al. |
| 4,916,806 | A | 4/1990 | Lorenzen |
| 5,113,317 | A | 5/1992 | Howe |
| 5,535,100 | A | 7/1996 | Lubhan et al. |
| 6,116,566 | A | 9/2000 | Brown et al. |
| 6,813,165 | B2 | 11/2004 | Cheng et al. |

FOREIGN PATENT DOCUMENTS

EP          264 840        4/1988

*Primary Examiner*—Michael C Zarroli
(74) *Attorney, Agent, or Firm*—Klaus P. Stoffel; Wolff & Samson PC

(57) ABSTRACT

A board mounting device (20) which includes a base carrier (10) that can be snapped down on a board (14). The base carrier (10) includes at least one locking hook (22) which engages behind the board (14) in the mounted condition of the device (20). The device (20) further includes a device carrier (11), connected with the base carrier (10), which is adapted to be moved relative to the base carrier (10). The locking hook (22) is provided with at least one shoulder (43) on which the device carrier (11) is supported by at least one guide pin (31, 40, 50, 60) before the device (20) is in its mounted condition.

13 Claims, 11 Drawing Sheets

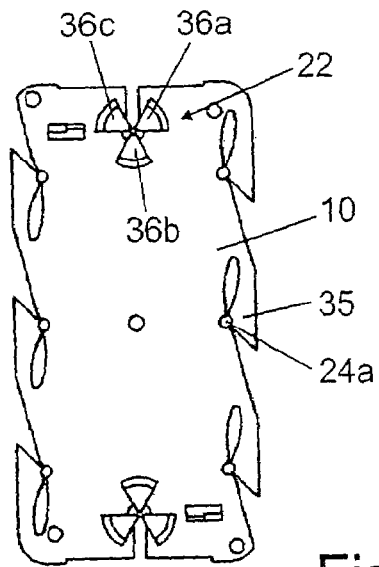
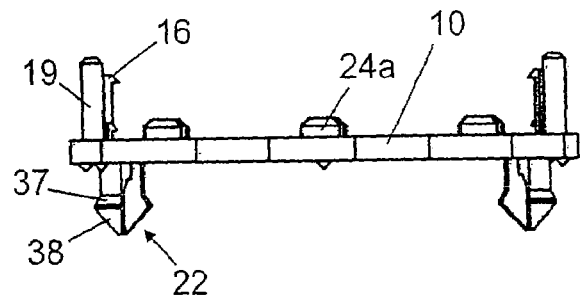
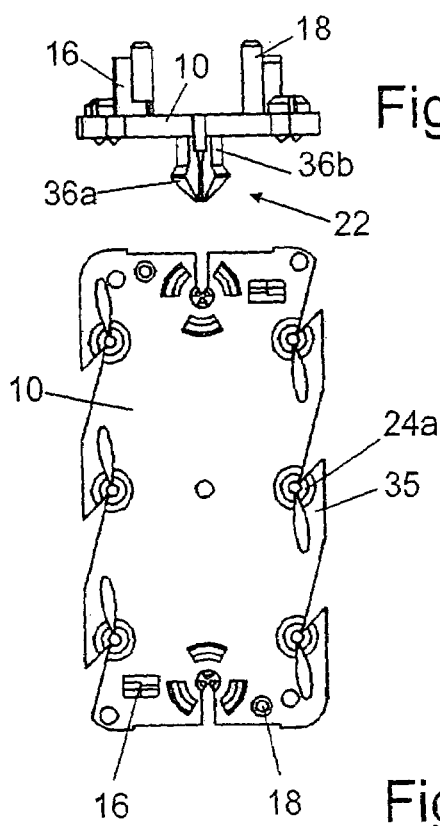
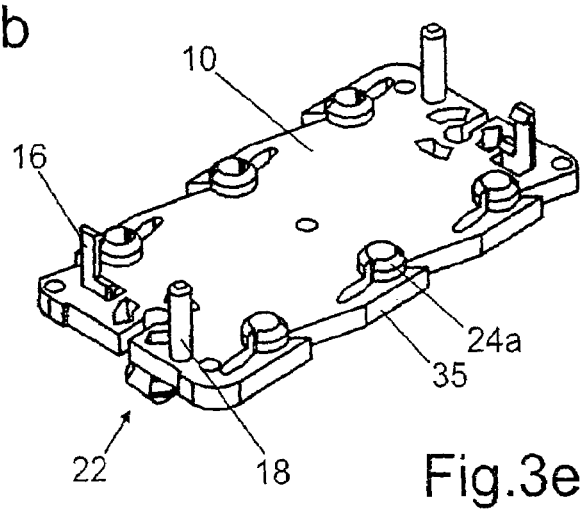
Fig.3a  Fig.3c  Fig.3b  Fig.3d  Fig.3e

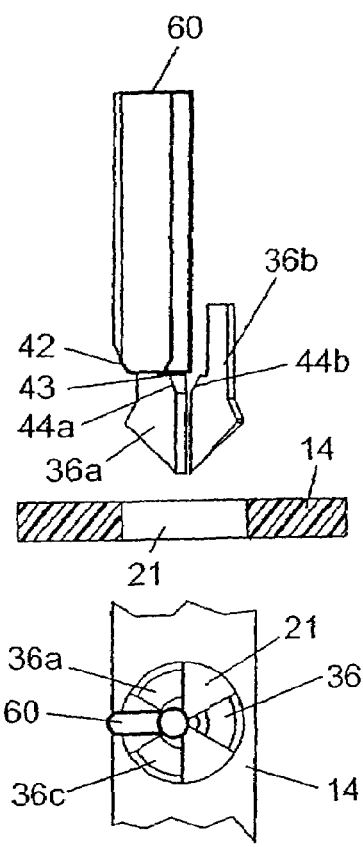
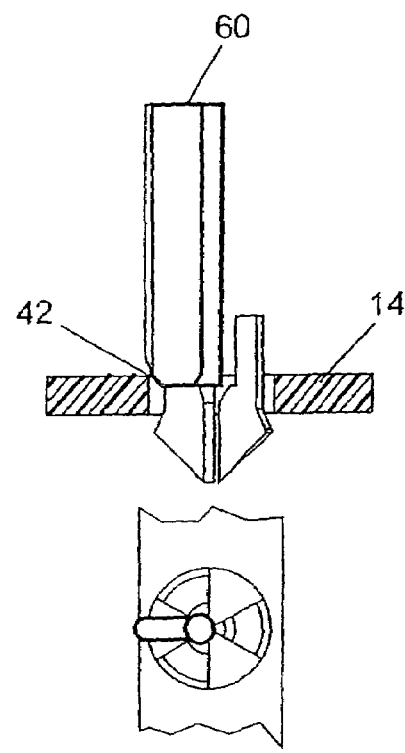
Fig.6a
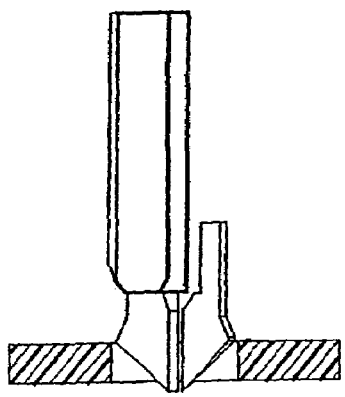
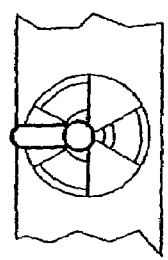
Fig.6b
Fig.6c
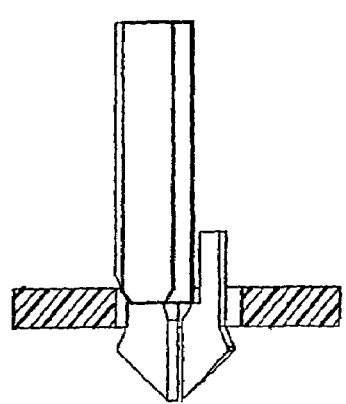
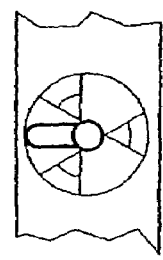
Fig.6d

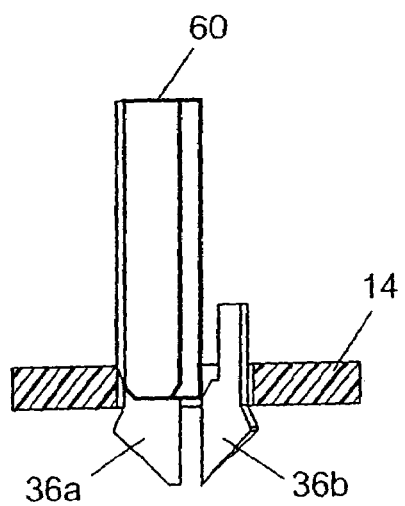
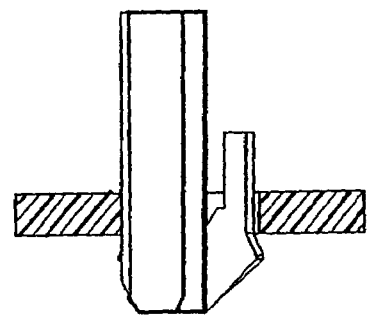
Fig.6e  Fig.6g
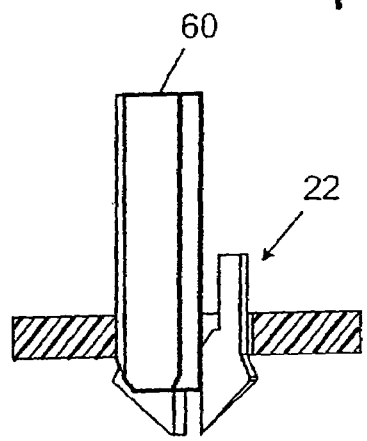
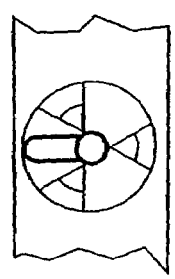
Fig.6f

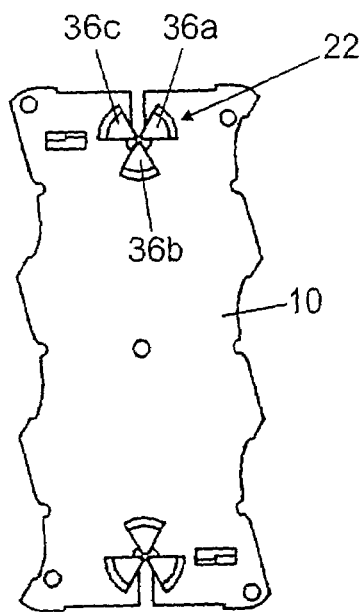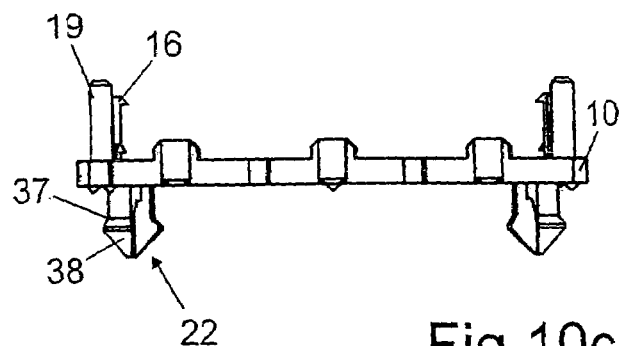
Fig.10a
Fig.10c
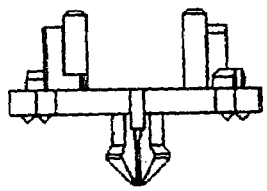
Fig.10b
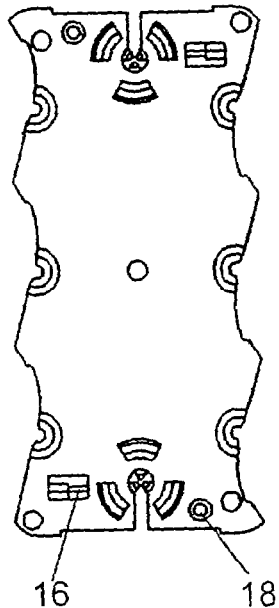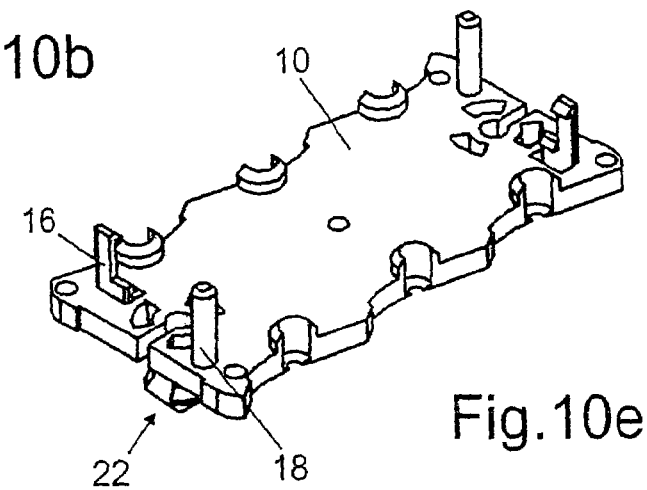
Fig.10e
Fig.10d

BOARD-MOUNTING DEVICE

BACKGROUND OF THE INVENTION

The is a Divisional of U.S. patent application Ser. No. 11/236,340 filed Sep. 27, 2005 issued as U.S. Pat. No. 7,269,031. Priority is claimed on that application and on the following application:

Country: Germany, Application No. 10 2004 047 117.7, filed Sep. 27, 2004

The present invention relates to a board-mounting device according to the preamble of the independent Claim.

There has been known from EP 264 840 A2 a device of the described species which comprises two parts adapted to move one relative to the other. The first such part is a base carrier, adapted to be snapped dawn on the board. which comprises a predetermined number of detent legs provided with projections that engage behind the opposite side .of the board in the mounted condition of the device. The base earlier comprises further locking elements that cooperate with the detent elements and are arranged in the second part which is configured as a device carrier. The locking elements of the device carrier may be arranged .on bridges of the device carrier.

In their delivery condition, the two parts are fixed one relative to the other in a first locked position. Mounting is effected by applying a pressure an the device carrier in the direction .of the board, whereby the detent legs pass and engage behind the bores in the board. The device carrier remains in the first lacked position relative to the base carrier during that action. After mounting of the base carrier. the device earlier is then moved from the first into the second locked position and. thus, into its final mounting position, by application of a further pressure on the device carrier in the direction of the board.

The bridges of the device carrier may also be pushed through the bores in the board, which accommodate the detent legs in the mounted condition of the base carrier. This has the result that the bridges and the detent legs will be clamped one relative to the other.

The base carrier may be provided with wire bushings for guiding through connection wires of the devices that are pushed through corresponding bores as the two parts are pressed together.

Due to mechanical stresses to which the devices may be subjected during transport or other operations carried out in preparation of the assembly of the board, it cannot be excluded that the device carrier may get displaced from the first into the second locked position unintentionally. In this joined position, mounting the device is, however, no longer possible. Pushing the device carrier back from the second into the first position is of course possible in principle. In the context of an automated board mounting process, such a device will however be classified as defective.

Further, there may also arise situations during assembly where the device carrier is moved unintentionally from the first to the second locking condition. Any canting of the device relative to the board, for example, leads to higher forces being required for snapping down the base carrier on the board. Higher forces may be required for snapping the base carrier down on the board also if a burr should be encountered on the board, for example. The higher pressure which then has to be applied on the device carrier may cause the device carrier to be moved from the first to the second locked position unintentionally before the base carrier is snapped down on the board.

SUMMARY OF THE INVENTION

Now, it is the object of the present invention to improve a device of the described species so as to permit easier handling.

The invention relates to a board-mounting device which comprises a base carrier that can be snapped down on a board. The base carrier comprises at least one locking hook which engages behind the board in the mounted condition of the device. The device further comprises a device carrier, connected with the base carrier, which is adapted to be moved relative to the base carrier. The invention provides that the locking hook is provided with at least one shoulder on which the device carrier is supported by at least one guide pin before mounting of the device.

The feature provided by the invention prevents the device carrier from being unintentionally displaced relative to the base carrier before the mounting operation as such is carried out. This improves the availability of the devices, which is a significant advantage in series production, especially in automated series production.

One such embodiment relates to the locking hook, which preferably comprises an upper chamfer by which it can engage behind the board. That feature permits the tolerances of the diameter of the locking hook relative to the diameter of the bore of the board on the one hand and the thicknesses of the board material on the other hand to be increased. Further, the locking hook preferably comprises an inner chamfer which guarantees easy guiding of the guide pin as the device carrier is displaced relative to the base carrier in the mounting direction. According to another embodiment, the locking hook comprises at least two locking elements, which are in contact with the guide pin at least in part so that the guide pin is clamped in position by the locking elements before the mounting operation.

One embodiment relates to the guide pin, where the forward area, viewed in the mounting direction, is preferably provided with a chamfer or a rounded portion. This feature assists guiding of the guide pin in the locking elements.

An especially advantageous embodiment provides that the guide pin comprises a feeler element that pushes the guide pin away from the shoulder when the board is reached.

The arrangement of the feeler element, which according to one embodiment comprises a chamfer, may be such that the guide pin is pushed off the shoulder by the feeler element or the chamfer during the mounting operation at the latest possible point in time, shortly before the locking hook reaches the mounted position. A corresponding arrangement of the guide pin alone may be selected if a chamfer is provided on the guide pin rather than on the feeler element.

According to one embodiment, the feeler element is elastic. This permits the feeler element to be bent off toward the top, against the mounting direction, in the bore of the board during the further mounting operation.

Another embodiment provides that the guide pin is supported on a shoulder of at least one locking element of that locking hook which is located at the smallest distance from the nearest locking hook or a nearest centering pin. This prevents the guide pin from being pushed off the shoulder, transversely to the mounting direction, when the device is compressed during transport or any handling operation or during assembly of the device.

An alternative embodiment provides that the base carrier comprises at least one centering pin and that the locking hook is arranged on the base carrier nonconcentrically relative to the bore in the board that accommodates the locking hook. While in the case of the other embodiments the other guide pin is displaced laterally or is bent off during the mounting operation, relative to the mounting direction, pushing the guide pin off the shoulder is effected in the case of this embodiment by displacing or bending off the locking hook. This embodiment is especially suited for lower-weight devices where the locking hook preferably comprises two locking elements only.

According to a particularly favorable further development of that embodiment, at least two locking hooks are provided which are mounted on the base carrier in non-concentric arrangement relative to the respective corresponding bores in the board. If two locking hooks are provided, these preferably are arranged on the base carrier symmetrically and non-concentrically relative to the respective corresponding bores in the board. That further development is especially suited for devices of medium size where the locking hooks can be bent laterally during assembly at least to such an extent that the guide pin is released by the shoulder. It is, especially, a substantial advantage of that further development that it can do without any centering knobs or other centering elements.

According to an advantageous further development, the device carrier comprises at least one spring element for fixing a connection line of the device. This feature does away with the requirement to thread the connection line into a bore.

Another advantageous further development, likewise relating to the device carrier, provides that the device carrier comprises at least one connection-line retaining member which fixes the connection line in a position at least approximately parallel to the board surface in the mounted condition of the device. This further development is especially suited for providing SMD devices (surface-mounted devices). During the mounting operation the connection line, being fixed at least approximately parallel to the board surface, is pressed by the connection-line retaining member into a soldering paste applied on the board surface.

According to one embodiment, the connection of the base carrier with the device carrier in the non-mounted condition is secured by at least one hook that engages in a hook recess.

According to another embodiment, the direction of displacement of the base carrier and the device carrier one relative to the other is predefined by at least one guide element that engages a guide element recess.

Other advantageous further developments and embodiments of the device according to the invention will become apparent from further dependent claims and from the description that follows.

BRIEF DESCRIPTION OF THE DRAWINGS

FIGS. 3a-3e show different views of a base carrier according to a first embodiment;

FIGS. 6a-6g illustrate a board-mounting operation using an alternative embodiment of a device according to the invention;

FIGS. 10a-10e show different views of a base carrier according to another embodiment.

DESCRIPTION OF THE INVENTION

Figure 1:
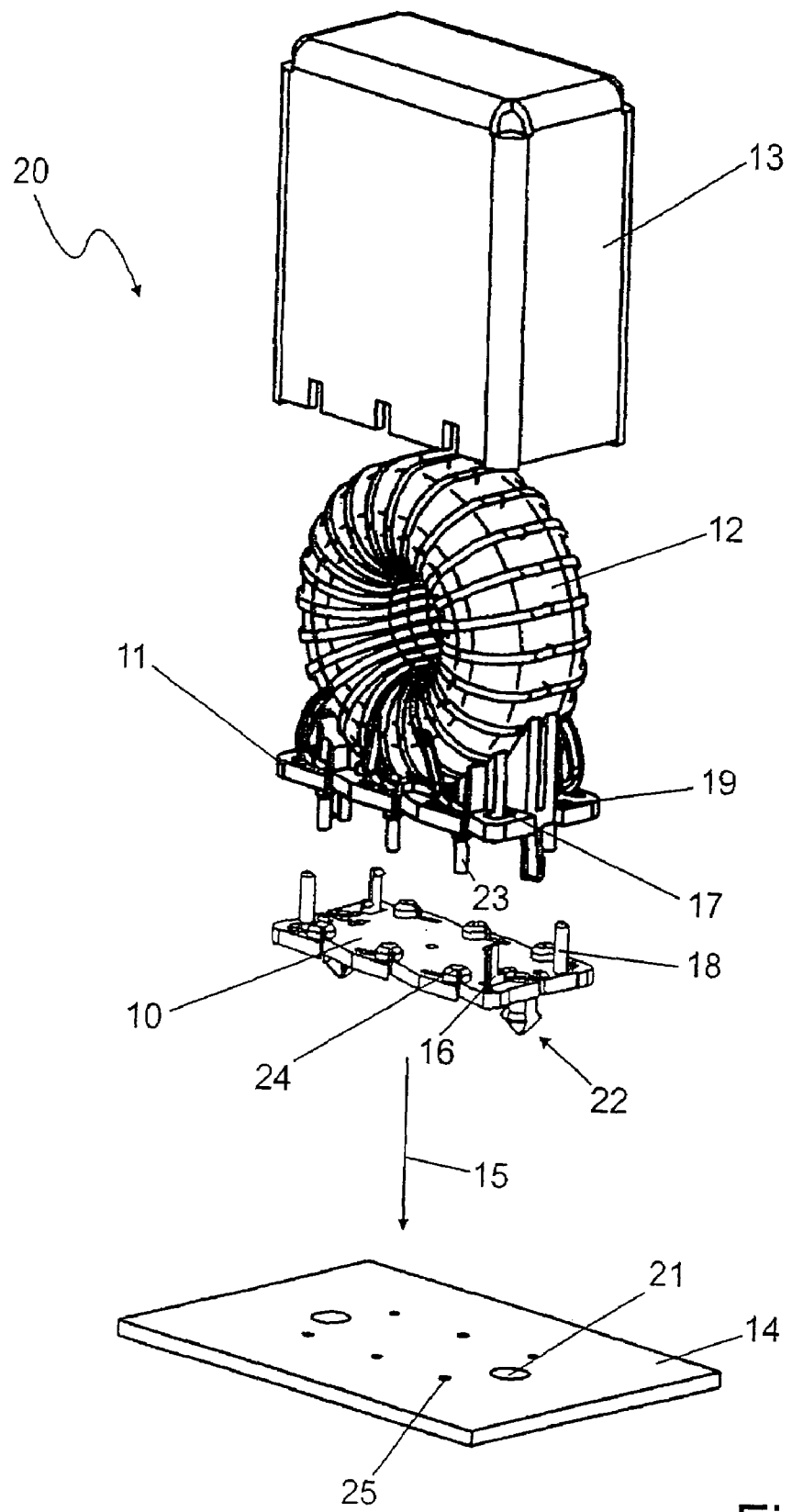
FIG. 1 shows different components of a device according to the invention intended to be mounted on a board.

FIG. 1 shows a base carrier 10, a device carrier 11, an electric component 12, a housing 13 and a board 14, illustrated separately for reasons of clarity. In the delivery condition, the electric component 12 is preferably mounted on the device carrier 11. The device carrier 11 is connected with the base carrier 10 in the delivery condition, and the base carrier 10 and the device carrier 11 are movable one relative to the other at least in the mounting direction 15.

The connection of the base carrier 10 with the device carrier 11 is secured in the delivery condition or in the non-mounted condition of the device for example by at least one hook 16 that engages a hook recess 17. The direction of displacement, which corresponds to the mounting direction 15, is defined by at least one guide element 18 which engages a guide element recess 19. In the illustrated embodiment, both the at least one hook 16 and the at least one guide element 18 are associated to the base carrier 10, and the hook recess 17 as well as the guide element recess 19 are associated to the device carrier 11.

The base carrier 10, the device carrier 11, in some cases the electric component 12 and the housing 13, which may protect the electric component and may be connected with the device carrier 11, form together a device 20 according to the invention.

The device 20 is intended for being mounted On the board 14, During mounting, the base carrier 10 is initially snapped into position by at least one detent hook 22 guided in a bore 21 of the board, either manually or, for example, with the aid or a sequential pressing tool not shown in detail. In the second step, at least one connection line 23 of the electric component 12, being already fixed by a connection-line retaining member 24 provided in the base carrier 10, is pushed into a connection line bore 25 provided in the board 14. In the mounted condition of the device 20 the base carrier 10 and the device carrier 11 are located one closely above the other.

Figure 2A:
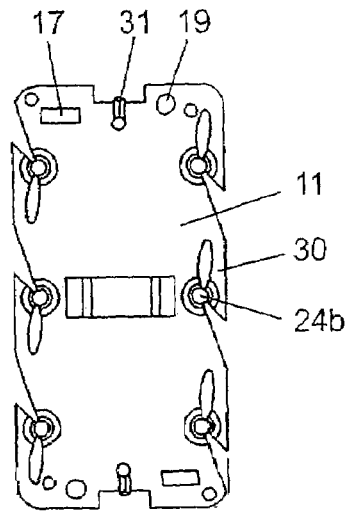
FIGS. 2a-2e show different views of a device carrier according to the first embodiment.

FIG. 2a shows the lower surface of the device carrier 11. Those parts shown in FIGS. 2a-2e, which conform to the parts illustrated in FIG. 1, are indicated by the same reference numerals. At least one spring element 30 is formed in the device carrier 11, which permits at least one connection line 23 to be introduced from the side, instead of being pushed through, At least one guide pin 31 is arranged on the bottom surface.

Figure 2C:
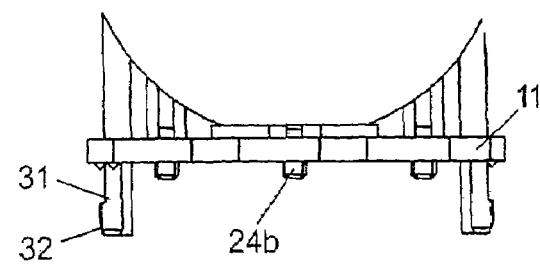
Figure 2B:
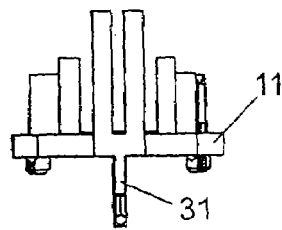
Figure 2E:
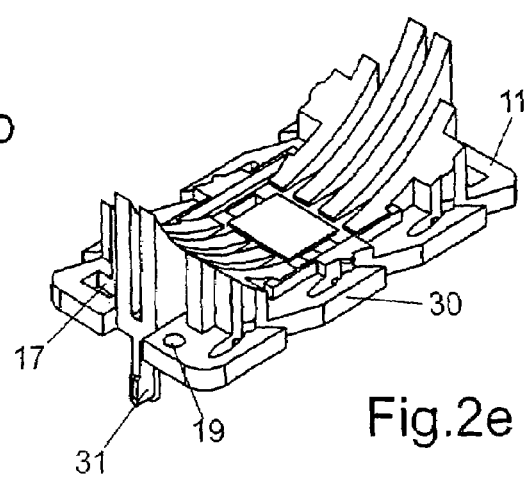
Figure 2D:
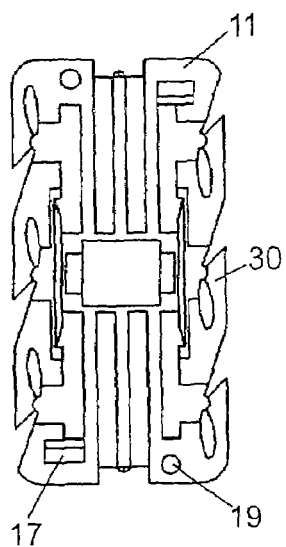

FIG. 2b shows a side view of the narrow side, FIG. 2c shows a side view of the wide side of the device carrier 11. The guide pin 31 is provided with an outer lateral chamfer 33, viewed in the mounting direction 15. FIG. 2d shows a top view of the device carrier 11, FIG. 2e shows a perspective view of the device carrier 11.

FIG. 3a shows the lower surface of the base carrier 10. Those parts shown in FIGS. 3a-3e, which conform to the parts illustrated in the preceding figures, are indicated by the same reference numerals. At least a second spring element 35 is formed in the base carrier 10, which element forms part of the connection line fixing means 24. The second spring element 35 likewise permits the at least one connection line 23 to be introduced from the side. The bottom surface shows the at least one locking hook 22 which in the illustrated embodiment is composed of three locking elements 36a, 36b, 36c.

FIG. 3b, shows a side view of the narrow side, FIG. 3c shows a side view of the wide side of the base carrier 10. The locking hook 22 comprises an outer chamfer 37 providing for a tolerance with respect to the diameter of the locking hook 22 relative to the diameter of the bore 21 in the board on the one hand and the material thickness of the board 14 on the other hand. The locking hook 22 further comprises a lower chamfer 38 allowing the bore 21 in the board to be centered. FIG. 3d shows a top view of the base carrier 10, FIG. 3e shows a perspective view of the base carrier 10.

It cannot be excluded that due to mechanical stresses acting on the device 20 during transport, during preparation for production and at the beginning of the mounting operation, the device carrier 11 may be displaced unintentionally in the mounting direction, whereby the at least one guide pin 31 may be pushed into the at least one locking hook 22 so as to expand the locking elements 36a, 36b, 36c. In this joined position, mounting the device 20 is. however, no longer possible. Pushing the device carrier 11 back in a direction opposite to the mounting direction 15 is of course possible in principle. Any manual action of that kind is however disadvantageous in an automated board mounting process. Devices 20 in that condition will therefore be classified as defective.

There may also arise situations during the mounting operation where the device carrier 11 is displaced unintentionally relative to the base carrier 10, in the mounting direction 15. For example, canting of the device 20 relative to the board 14 will require application of a higher force for snapping down the locking hook 22 on the board 14. Likewise, a burr on the bore 21 of the board, for example, may also lead to a higher force being required for snapping down the locking hook 22 on the board 14. As a result of the higher, force that must be exerted upon the device carrier 11, the device carrier 11 may be displaced unintentionally in the mounting direction 15, relative to the base carrier 10, before the locking hook 22 is snapped dawn on the board 14.

It is provided according to the invention that the at least 'One lacking hook 22 comprises a shoulder an which the device carrier 11 is supported by at least one guide pin 31 before reaching its mounted condition.

FIG. 4 relates to a first embodiment of the guide pin 31. FIGS. 4a-4g show seven different mounting conditions of the device 20. FIG. 4 shows the position of the guide pin 31, designated herein as the first guide pin 40, and 'Of the first locking element 36a, 36b in the delivery condition of the device 20, before the mounting 'Operation. The first guide pin 40 comprises a feeler element 41 provided with a chamfer 42 in the mounting direction 15. The lacking element 36a comprises a shoulder 43 an which the first guide pin 40 can be supported. The lacking elements 36a, 36b are provided with an inner chamfer 44a, 44b. The guide pin 40 comprises a chamfer 'Or a rounded portion 45 at its forward end, viewed in the mounting direction 15.

Figure 4A:
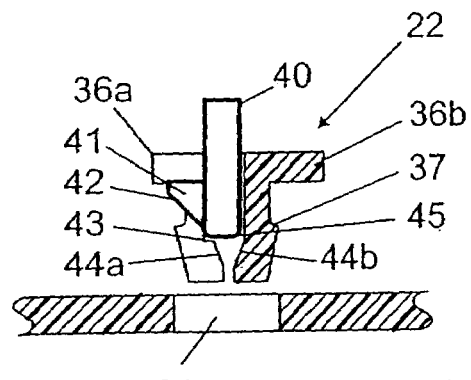
FIGS. 4a-4g illustrate a board-mounting operation using a first embodiment of a device according to the invention.

As illustrated in FIG. 4a, the mounting operation starts by approaching the device 20 to the board 14. The locking hook 22 is centered above the bore 21 'Of the board, at least approximately. During the centering operation, which is completed in the position illustrated in FIG. 4b, the lower chamfer 38 of the locking hook 22 balances out any existing tolerance. In the position illustrated in FIG. 4c, the chamfer 42 'Of the feeler element 41 comes into contact With the board 14 for the first time. The pressure applied an the device 20 in the mounting direction 15 produces a farce which acts to push the first guide pin 40 'Off the shoulder 43 in a direction transverse to the mounting direction 15. Once the position illustrated in FIG. 4c is reached, the device carrier 11 and the base carrier 10 can be displaced one relative to the other far the first time in the mounting direction 10.

Figure 4E:
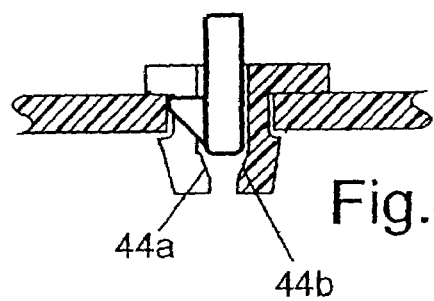
Figure 4B:
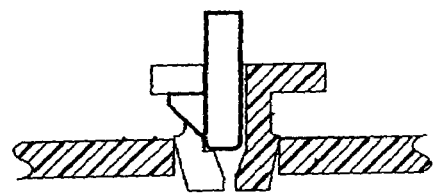
Figure 4F:
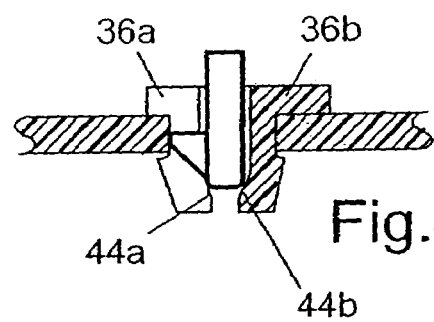
Figure 4C:
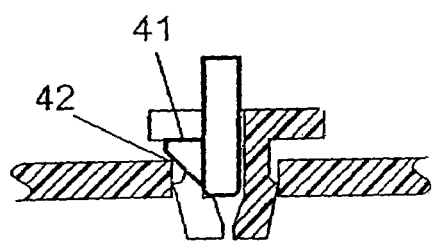
Figure 4G:
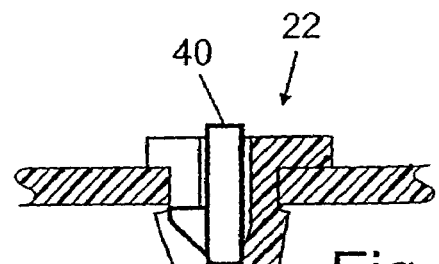
Figure 4D:
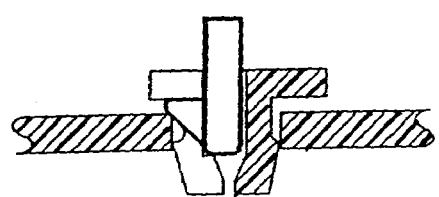
Figure 5A:
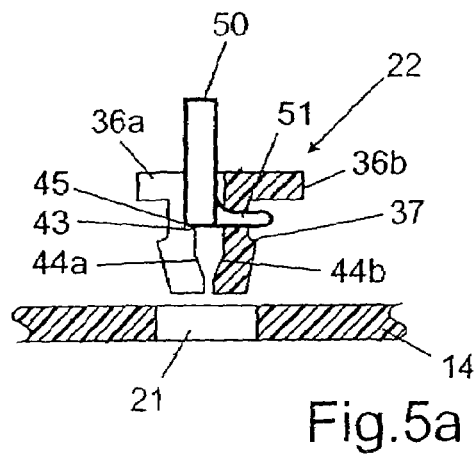
FIGS. 5a-5f illustrate a board-mounting operation using an other embodiment of a device according to the invention.
Figure 5D:
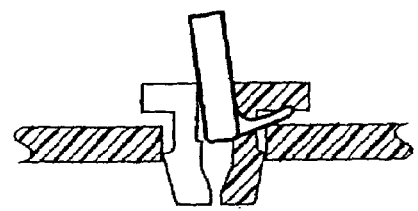
Figure 5B:
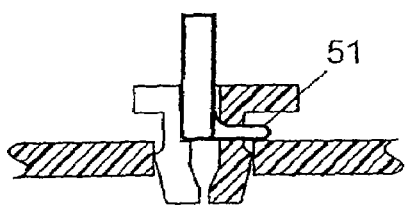
Figure 5E:
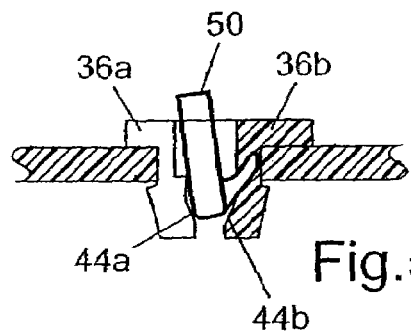
Figure 5C:
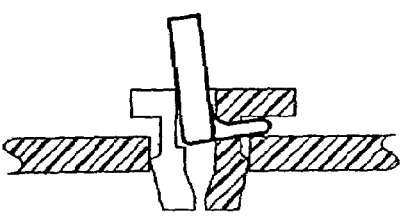
Figure 5F:
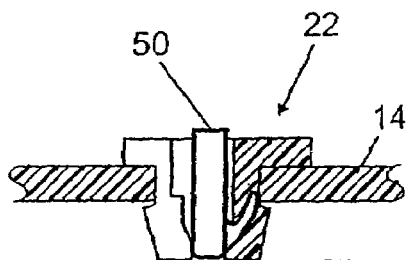

Once the position illustrated in FIG. 4e is reached, the locking hook 22 starts to engage behind the board 14. The mounted position is reached by the locking hook 22 in the position illustrated in FIG. 4f. As a result of the upper chamfer 37, any tolerances between the diameter of the locking hook 22, the diameter of the bore 21 in the board on the one hand, and the material thickness of the board 14 on the other hand can be tolerated. After the position illustrated in FIG. 4f has been reached, the first guide pin 40 is displaced together with the device carrier 11 relative to the locking hook 22, in the mounting direction 15, during which process, starting with the position illustrated in FIG. 4f, the first guide pin 40 comes to slide along the inner chamfer 44a, 44b of the locking elements 36a, 36b, thereby expanding the locking elements 36a, 36b. The locking hook 22 and the first guide pin 40 are clamped one relative to the other, and the locking hook 22 is clamped relative to the board 14 and fixed in that position.

FIG. 5 shows a different embodiment of the guide pin, hereafter designated as second guide pin 50. Those parts illustrated in FIG. 5 that conform to the parts illustrated in the preceding Figures are designated by the same reference numerals. The second guide pin 50 comprises an elastic feeler element 51. Starting from the position illustrated in FIG. 4b, the elastic feeler element 51 comes into contact with the board 14. The resulting force acts to pull the second guide pin 50 away from the shoulder 43. Starting from the position illustrated in FIG. 5d, the second guide pin 50 is moved relative to the locking hook 22 in the mounting direction 15 so that starting from the position illustrated in FIG. 5e the second guide pin 50 slides along the inner chamfer 44a, 44b of the locking elements 36a, 36b thereby expanding the locking elements 36a, 36b. As a result of the particular embodiment of the elastic feeler element 51, the elastic feeler element 51 is bent off to the rear, in a direction opposite to the mounting direction 15. FIG. 5f corresponds to the mounted position of the device 20 illustrated in FIG. 5g, where the second guide pin 50 and the locking hook 22, as well as the locking hook 22 and the board 14 are clamped one relative to the other and are fixed in position.

Finally, FIG. 6 shows the position during assembly of the guide pin 31, which is configured, at least approximately, according to the representation illustrated in FIG. 2 and which will be described hereafter as third guide pin 60. Those parts illustrated in FIG. 6 that conform to the parts illustrated in the preceding Figures are designated by the same reference numerals. In addition to views of the third guide pin 60 the locking hook 22 and the board 14, FIGS. 6a-6g show top views of the guide pin 60 and the Jacking hook 22, respectively. In the position illustrated in FIG. 6c, the chamfer 42 of the third guide pin 60 is in contact with the board 14 for the first time. The third guide pin 60, which had been. supported before on the shoulder 43 when a pressure was exerted on the device 20 in the mounting direction 15, is now pushed off the shoulder 43 and starts to expand the locking elements 36a, 36b as illustrated in FIG. 6e. As a result of that expansion, the locking hook 22 reaches its final mounted position. In the position illustrated in FIG. 6f, the third guide pin 60 is displaced, together with the device carrier 11, relative to the locking hook 22 in the mounting direction 15 until the mounted position of the device 20 is reached, as illustrated in FIG. 6g.

An advantageous further development provides that the feeler element 41, 51 or the chamfer 42 comes into contact with the board 14 for the first time when the locking hook 22 has almost reached the mounted position where the locking hook 22 engages behind the board 14. It is ensured in this way that the guide pin 40, 50, 60 will be pushed off the shoulder 43 of the locking hook 22 at the latest possible point in time during mounting of the device 20.

Another advantageous alternative embodiment of the invention provides that, instead of being moved in transverse direction, relative to the plane of the board 14, the guide pin 31, 40, 50, 60, being supported on the shoulder 43, is centered substantially above the bore 21 in the board already at the beginning of the mounting operation, once the feeler element 41 comes into contact with the board 14. Such centering may be effected for example by centering knobs or other suitable centering elements—not shown—that fix the base carrier 10 on position relative to the board 14. It is an important aspect in that connection that the locking hook 22 is not centered in this position. Rather, the locking hook 22 is bent off laterally during the mounting operation at least to an extent that ensures that the guide pin 31, 40, 50, 60 is released by the shoulder 43.

That embodiment is particularly well suited for comparatively light-weight devices 20, Further, the locking hooks 22 of that embodiment preferably contain only two locking elements 36a, 36b that can be bent relatively easily by at least a few 0.1 mm. For heavier devices, an embodiment of the locking hook 22 having three locking elements 36a, 36b, 36c will be particularly well suited.

Figure 7:
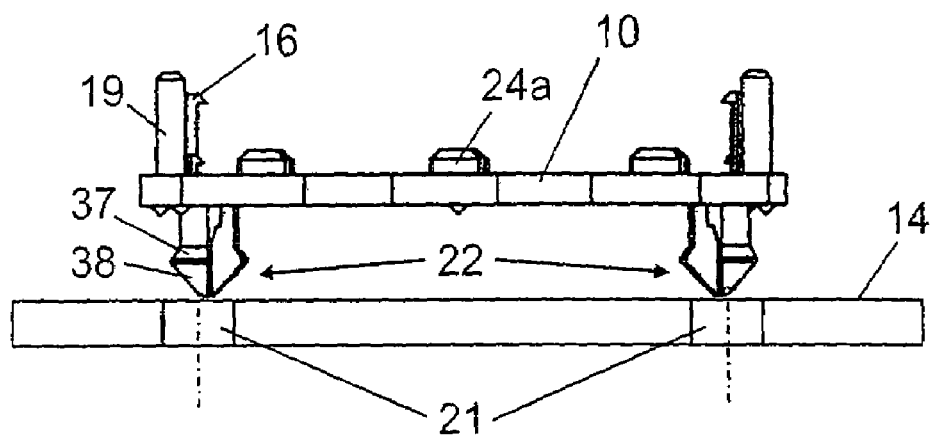
FIG. 7 shows one position of an especially designed base carrier relative to the board.
Figure 8A:
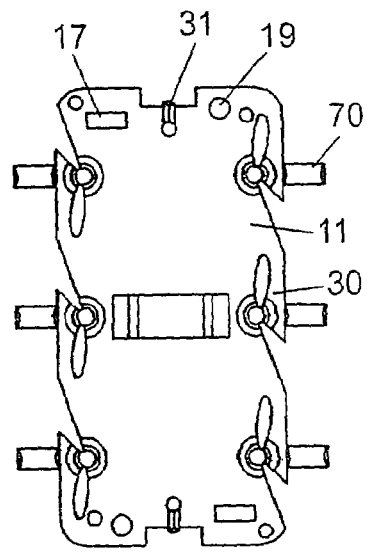
FIGS. 8a-8e show different views of a device carrier according to another embodiment.
Figure 8C:
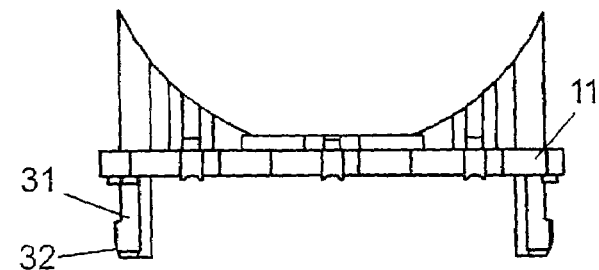
Figure 8B:
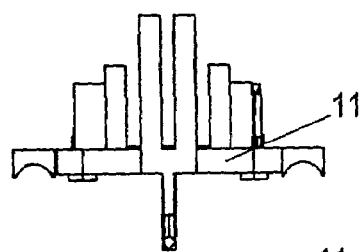
Figure 8D:
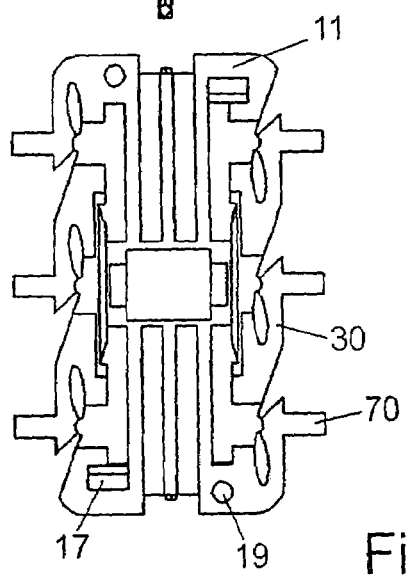
Figure 8E:
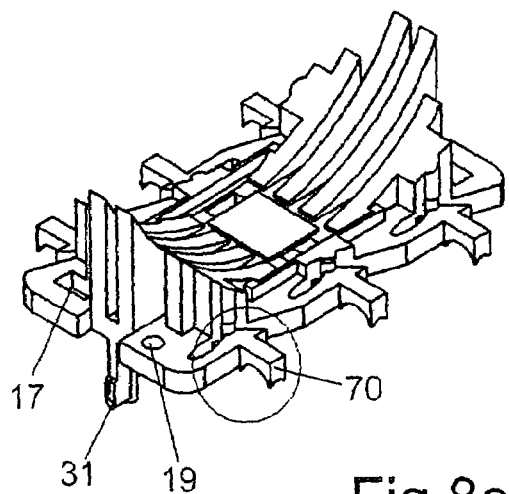

According to an especially advantageous further development of that embodiment, at least two locking hooks 22 are provided which are arranged on the base carrier 10 in non-centric arrangement relative to the respective corresponding bores 21 in the board. One embodiment of the further development comprising two locking hooks 22 is illustrated in FIG. 7. FIG. 7 shows the position of the base carrier 10 illustrated in FIG. 3c, relative to the bore 21 in the board 14. If two locking hooks 22 are provided, these are arranged on the base carrier 10 preferably symmetrically and non-centrically relative to the respective corresponding bores 21 in the board. That further development is particularly well suited for devices of medium size where the locking hooks 22 can be bent laterally during the mounting operation at least to an extent to ensure that the guide pin 31, 40, 50, 60 can be released by the shoulder 43. The deviation from centric arrangement of the locking hooks 22, relative to the corresponding bores 21 in the board, is for example in the order of a few 0.1 mm so that at the beginning of the mounting operation the locking hooks 22 can in any case enter the bores 21 of the board, at least in part. It is the essential advantage of that further development that any centering knobs or other centering elements can be omitted in this case.

Another embodiment relates to the way in which the at least one guide pin 31, 40, 50, 60 is supported on the shoulder 43 of the at least one locking hook 22.

Preferably. the shoulder 43 is positioned at the smallest possible spacing from a nearest locking hook or a nearest centering pin—not shown in detail—or a nearest centering knob—not shown in detail. This feature prevents the guide pin 31, 40. 50, 60 from being unintentionally pushed off the shoulder 43 if the device 20 should be compressed in a direction at least approximately transverse to the mounting direction 15. A compressive load of that kind cannot always be excluded during transport of the device, during operations carried out in preparation of the assembly process, or at the beginning of the mounting process.

FIG. 8 shows an especially advantageous embodiment of a device carrier 11. Those parts illustrated in FIG. 8 that conform to the parts illustrated in the preceding Figures are designated by the same reference numerals. In FIG. 8a, the bottom surface of the device carrier 11 is shown. The device carrier 11 comprises at least one connection-line retaining member 70. FIG. 8b shows a side view of the narrow side. FIG. 8c shows a side view of the wide side of the device carrier 11. FIG. 8d shows a top view, FIG. 8e shows a perspective view of the device carrier 11. The detail which includes the connection-line retaining member 70. especially marked in FIG. 8e, is shown in FIG. 9 in enlarged scale.

Figure 9:
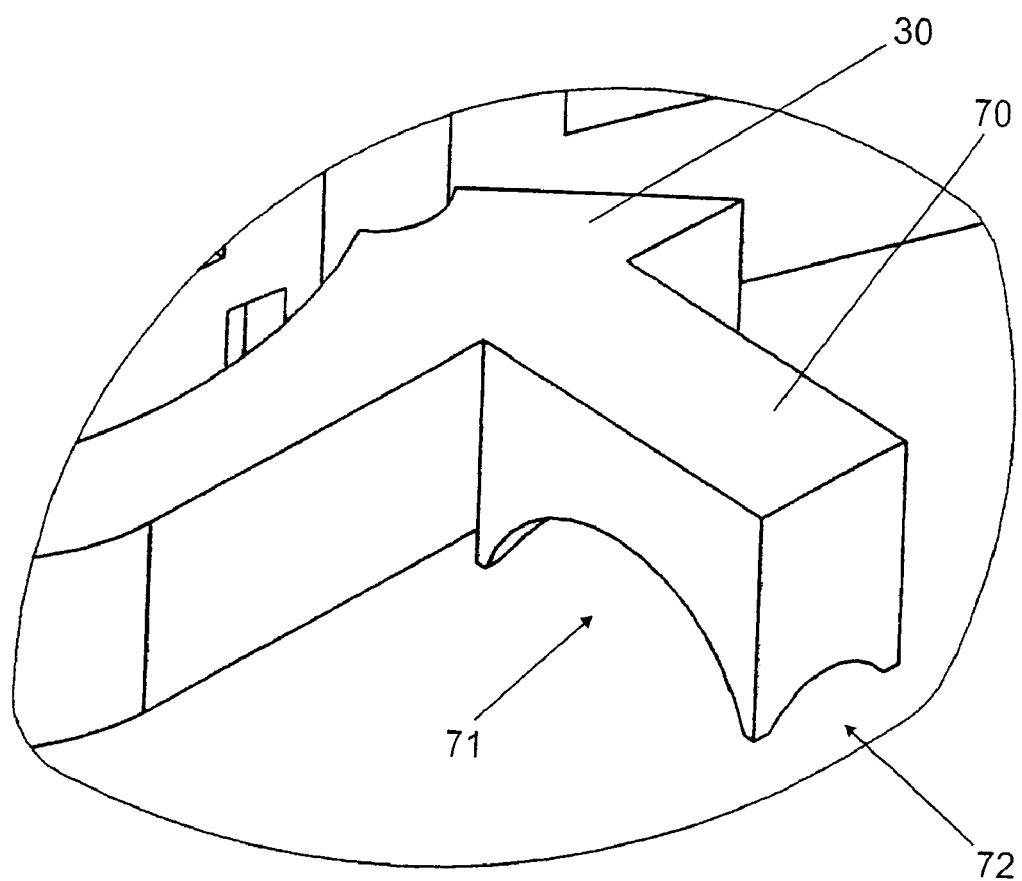
FIG. 9 shows a detail of the device carrier illustrated in FIGS. 8a-8e.

The connection-line retaining member 70 shown in detail in FIG. 9 is arranged on the first spring element 3D, for example. The connection-line retaining member 70 may comprise a recess 71, 72, both in the lengthwise direction and in the transverse direction of the device carrier 11. The at least one connection line 23 of the electric component 12 is positioned either below the recess 71. 72 arranged in lengthwise direction or below the one arranged in transverse direction. During assembly of the device carrier 11, the connection wire 23 is fixed on the surface of the board 14 by the connection-line retaining member 70. In this position, the connection wire 23 extends at least approximately in parallel to the board surface. The embodiment of the device carrier 11 having at least one connection-line retaining member 70 is suited in particular for a device 20 configured as surface-mounted device whose connection lines 23 are pressed by the connection-line retaining member 70 into prepared spots of soldering paste applied onto the upper surface of the board 14.

FIG. 10 shows an embodiment of the base carrier 10 which is modified with respect to the embodiment of the device carrier 11 with the at least one connection. line retaining member 70. Those parts illustrated in FIG. 10 that conform to the parts illustrated in the preceding Figures are designated by the same reference numerals. Compared with the base carrier 10 illustrated in FIG. 3, the second spring elements 35 are omitted in the embodiment according to FIG. 10 as the connection line 23 of the electric component 12 can be fixed in position by the connection-line retaining member 70 of the device carrier 11.

The invention claimed is:

1. Board-mounting device which comprises a base carrier (10) that can be snapped down on a board (14), the base carrier comprising at least one locking hook (22) which engages behind the board (14) in the mounted condition of the device (20), the device further comprising a device carrier (11), connected with the base carrier (10), which is adapted to be moved relative to the base carrier (10), wherein the locking hook (22) is provided with at least one shoulder (43) on which the device carrier (11) is supported by at least one guide pin (31, 40, 50, 60) before the device (20) is in its mounted condition.

2. The device as defined in claim 1, wherein the locking hook (20) comprises an upper chamfer (37) by which it can engage behind the board (14).

3. The device as defined in claim 1, wherein the locking hook (22) comprises an inner chamfer (44a, 44b) for guiding the guide pin (31, 40, 50, 60) in the mounting direction (15).

4. The device as defined in claim 1, wherein the locking hook (22) comprises at least two locking elements (36a, 36b, 36c) and the guide pin (31, 40, 50, 60) is clamped in position by the locking elements (36a, 36b, 36c).

5. The device as defined in claim 1, wherein the guide pin (31, 40, 50, 60) is provided with a chamfer or a rounded portion (45) in the forward area, relative to the mounting direction (15).

6. The device as defined in claim 1, wherein the shoulder (43) is part of at least one locking element (36*a*, 36*b*, 36*c*) of the locking hook (22), and the guide pin (31, 40, 50, 60) is supported on the shoulder (43) of the at least one locking element (36*a*, 36*b*, 36*c*) of the locking hook (22).

7. The device as defined in claim 1, wherein at least two locking hooks (22) are provided which are mounted on the base carrier (10) in non-centric arrangement relative to respective corresponding bores (21) in the board.

8. The device as defined in claim 7, wherein the locking hooks (22) are arranged on the base carrier (10) symmetrically and non-centrically relative to the respective corresponding bores (21) in the board.

9. The device as defined in claim 1, wherein the locking hook (22) comprises two locking elements (36*a*, 36*b*).

10. The device as defined in claim 1, wherein the locking hook (22) comprises three locking elements (36*a*, 36*b*, 36*c*).

11. The device as defined in claim 1, wherein at least two locking hooks (22) are provided.

12. The device as defined in claim 1, wherein the device carrier (11) comprises at least one connection-line retaining member (70) which fixes a connection line (23) of the device (20) in a position at least approximately parallel to the surface of the board (14).

13. The device as defined in claim 1, wherein the direction of displacement of the base carrier (10) and the device carrier (11) one relative to the other is predefined by at least one guide element (18) that engages a guide element recess (19).

\* \* \* \* \*